(12) United States Patent
Visokay et al.

(10) Patent No.: US 7,351,632 B2
(45) Date of Patent: *Apr. 1, 2008

(54) SEMICONDUCTOR CMOS DEVICES AND METHODS WITH NMOS HIGH-K DIELECTRIC FORMED PRIOR TO CORE PMOS SILICON OXYNITRIDE DIELECTRIC FORMATION USING DIRECT NITRIDATION OF SILICON

(75) Inventors: Mark Robert Visokay, Richardson, TX (US); Luigi Colombo, Dallas, TX (US); James Joseph Chambers, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 277 days.

This patent is subject to a terminal disclaimer.

(21) Appl. No.: 11/118,842

(22) Filed: Apr. 29, 2005

(65) Prior Publication Data

US 2006/0246647 A1 Nov. 2, 2006

(51) Int. Cl.
*H01L 21/8238* (2006.01)

(52) U.S. Cl. .............. 438/216; 438/275; 438/287; 257/E21.639

(58) Field of Classification Search ........ 438/206, 438/218; 257/E21.176, E21.177, E21.19, 257/E21.611, E21.615

See application file for complete search history.

(56) References Cited

U.S. PATENT DOCUMENTS

| 6,528,858 | B1 | 3/2003 | Yu et al. |
| 6,538,278 | B1 | 3/2003 | Chau |
| 2002/0140098 | A1* | 10/2002 | Takayanagi .......... 257/758 |

OTHER PUBLICATIONS

U.S. Appl. No. 11/118,237, filed Apr. 29, 2005, Colombo et al.
U.S. Appl. No. 11/118,843, filed Apr. 29, 2005, Chambers et al.

* cited by examiner

*Primary Examiner*—Michael Lebentritt
*Assistant Examiner*—Cheung Lee
(74) *Attorney, Agent, or Firm*—W. James Brady, III; Frederick J. Telecky, Jr.

(57) ABSTRACT

The present invention facilitates semiconductor fabrication by providing methods of fabrication that selectively form high-k dielectric layers within NMOS regions. An oxide layer is formed in core and I/O regions of a semiconductor device (506). The oxide layer is removed (508) from the core region of the device. A high-k dielectric layer is formed (510) over the core and I/O regions. Then, the high-k dielectric layer is removed (512) from PMOS regions of the core and I/O regions. A silicon nitride layer is grown (516) within PMOS regions of the core and I/O regions by a low temperature thermal process. Subsequently, an oxidation process is performed (518) that oxidizes the silicon nitride into silicon oxynitride.

24 Claims, 15 Drawing Sheets

CORE REGION

I/O REGION

CORE REGION

I/O

CORE REGION

I/O

CORE REGION

I/O

CORE REGION

I/O

CORE REGION

I/O

CORE REGION

I/O REGION

CORE REGION

I/O REGION

SEMICONDUCTOR CMOS DEVICES AND METHODS WITH NMOS HIGH-K DIELECTRIC FORMED PRIOR TO CORE PMOS SILICON OXYNITRIDE DIELECTRIC FORMATION USING DIRECT NITRIDATION OF SILICON

FIELD OF INVENTION

The present invention relates generally to semiconductor devices and more particularly to CMOS transistor devices and associated methods of manufacture that employ high dielectric constant layers.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-channel and p-channel (NMOS and PMOS) transistors are used to fabricate logic and other circuitry.

The source and drain are typically formed by adding dopants to targeted regions of a semiconductor body on either side of the channel. A gate structure is formed above the channel, having a gate dielectric formed over the channel and a gate electrode above the gate dielectric. The gate dielectric is an insulator material, which prevents large currents from flowing into the channel when a voltage is applied to the gate electrode, while allowing such an applied gate voltage to set up an electric field in the channel region in a controllable manner. Conventional MOS transistors typically include a gate dielectric formed by depositing or growing silicon dioxide ($SiO_2$) or silicon oxynitride (SiON) over a silicon wafer surface, with doped polysilicon formed over the $SiO_2$ or SiON to act as the gate electrode.

Continuing trends in semiconductor device manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface. However, there are electrical and physical limitations on the extent to which the thickness of $SiO_2$ or SiON gate dielectrics can be reduced. For example, very thin $SiO_2$ or SiON gate dielectrics are prone to gate tunneling leakage currents resulting from direct tunneling through the thin gate oxide. In addition, thin oxide layers provide a poor diffusion barrier to dopants.

Recent CMOS transistor scaling efforts have accordingly focused on high dielectric constant materials having dielectric constants greater than that of $SiO_2$ (e.g., substantially greater than about 3.9), which can be formed in a thicker layer than scaled $SiO_2$ or SiON, and yet produce equivalent field effect performance. The relative electrical performance of such high dielectric constant materials is often expressed as equivalent oxide thickness (EOT), because the high dielectric constant material layer may be thicker, while still providing the equivalent electrical effect of a much thinner layer of $SiO_2$ or SiON. Since the dielectric constant "k" is higher than $SiO_2$ or SiON, a thicker dielectric layer can be employed to mitigate tunneling leakage currents, while still achieving the equivalent electrical performance of a thinner layer of thermally grown $SiO_2$ or SiON.

The performance of the resulting MOS transistors is dependent upon the high-k gate dielectric material, including the bulk high-k material and on a thickness or equivalent oxide thickness of deposited material. Unlike $SiO_2$ or SiON, which may be formed by thermal oxidation (growth process), high-k dielectrics are typically deposited over the semiconductor substrate, using chemical vapor deposition (CVD), physical vapor deposition (PVD), atomic layer deposition (ALD), molecular beam epitaxy (MBE), or other deposition processes. While the macroscopic composition of these materials may be controlled to a certain extent during such deposition processes, stoichiometric variations within the film may degrade device performance. Therefore post deposition processes are generally required to attempt to control the material's properties in order to meet the electrical requirements.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor fabrication by employing high-k dielectric layers in NMOS regions while mitigating damage to the high-k dielectric layers during formation of dielectric layers within the PMOS regions. NMOS devices within an input/output (I/O) region having higher operation voltage requirements employ a high-k dielectric layer and an oxide layer as dielectric layers. PMOS devices within the I/O and core regions employ a silicon oxynitride layer as a dielectric layer. NMOS devices within a core region of the device employ only the high-k dielectric layer as a dielectric layer. As a result, high-k dielectric materials are employed for the NMOS devices without negatively impacting operation of the PMOS devices.

The silicon oxynitride layer employed with the present invention is formed by growing silicon nitride via a low temperature process. Subsequently, a low temperature oxidation process is performed that transforms the silicon nitride into silicon oxynitride. Employing the low temperature processes to form the silicon oxynitride mitigates crystallization and damage of the previously formed high-k dielectric layer as opposed to other silicon oxynitride formation processes that employ a thermal silicon dioxide growth process at a high temperature.

The present invention facilitates semiconductor fabrication by providing methods of fabrication that selectively form high-k dielectric layers within NMOS regions. An oxide layer is formed in core and I/O regions of a semiconductor device. The oxide layer is removed from the core region of the device. A high-k dielectric layer is formed over the core and I/O regions. Then, the high-k dielectric layer is removed from PMOS regions of the core and I/O regions. A silicon nitride layer is grown within PMOS regions of the core and I/O regions by a low temperature silicon nitride formation process. Subsequently, an oxidation process is performed that oxidizes the silicon nitride layer into silicon oxynitride. A re-nitridation process can also be performed to obtain a desired percentage or concentration and concentration profile of nitrogen.

BRIEF DESCRIPTION OF THE DRAWINGS

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
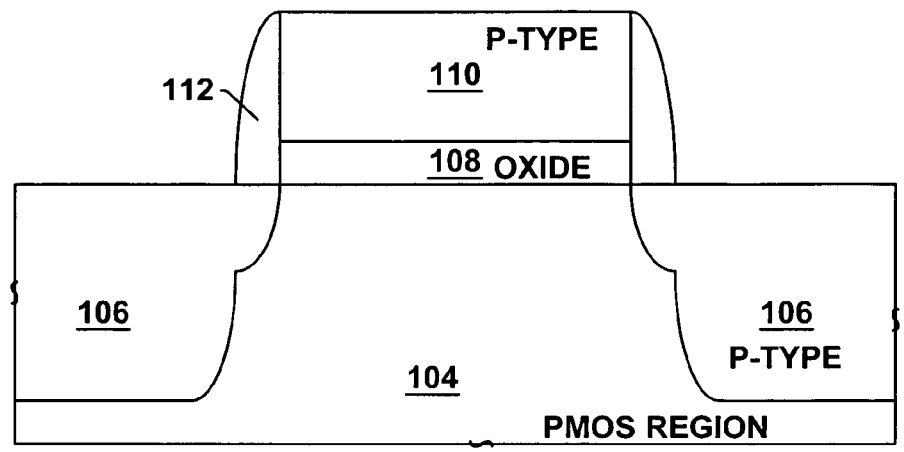
FIG. 1 is a cross sectional view of a conventional PMOS transistor device formed with oxide as a dielectric layer and a p-type doped polysilicon gate.

One or more implementations of the present invention will now be described with reference to the attached drawings, wherein like reference numerals are used to refer to like elements throughout, and wherein the illustrated structures are not necessarily drawn to scale.

It is appreciated that semiconductor devices can include transistor devices that operate at different voltages in different regions of the semiconductor device. As a result, these different devices require varied dielectric thicknesses. One conventional mechanism to account for the different types of devices is to form the transistor devices with the same oxide (silicon dioxide) dielectric thickness required for the higher voltage operation. As a result, transistor devices operating at a relatively low operating voltage were fabricated with a thicker gate dielectric than necessary. This extra thickness can slow operation or speed of such devices. Accordingly, performance of the semiconductor device, particularly transistor devices within the semiconductor device that operate at a relatively lower operating voltage, can be improved. Other conventional mechanisms include using level shifters to change voltage/power levels and the like.

It is also appreciated that semiconductor devices, including those with transistor devices operating at different voltages, can employ high-k dielectric materials in order to obtain an equivalent oxide thickness, but with a thicker dielectric layer than that for silicon dioxide ($SiO_2$) or silicon oxynitride (SiON). The high-k dielectric material can overcome problems associated with employing oxide as a dielectric layer, which are discussed in further detail below. However, high-k dielectric materials can introduce problems of their own and can degrade performance of PMOS transistor devices, as discussed below.

Some high-k dielectric materials, such as hafnium silicate (HfSiO), can be susceptible to crystallization and/or other damage due to other thermal processes. For example, growing thermal silicon dioxide (e.g., at 1000 degrees Celsius) can cause crystallization of already formed high-k dielectric layers. Crystallization of high-k dielectric materials can create defective grain boundaries, leakage pathways, dopant diffusion, and the like.

The present invention facilitates semiconductor fabrication by providing methods of fabrication that selectively integrate high-k dielectric layers into NMOS transistors for CMOS semiconductor devices without negatively impacting PMOS transistors and mitigating crystallization and the like of the high-k dielectric layers. Generally, use of high-k dielectric layers can permit decreased device size and improved device performance, but can present problems with PMOS devices including, but not limited to, threshold voltage shift, capacitor degradation, and polysilicon depletion. Undesirable effects resulting from the inclusion of the high-k dielectric layers, particularly with respect to PMOS devices, are mitigated by the present invention.

The present invention mitigates degradation of PMOS devices in both core and I/O regions by employing high-k dielectrics in NMOS devices and employing non-high-k dielectrics in PMOS devices. Furthermore, the present invention mitigates degradation to high-k dielectric layers by forming silicon oxynitride layers with low temperature processes. As a result, the benefits of employing high-k dielectrics for NMOS devices are retained while degradation of PMOS device performance is mitigated.

FIG. 1 is a cross sectional view of a conventional PMOS transistor device 100 formed with $SiO_2$ as a dielectric layer and a p-type doped polysilicon gate. This device 100 described is exemplary in nature and is provided to facilitate understanding of the present invention.

The device 100 comprises an n-type well region 104 formed within a p-type semiconductor substrate or body. Implanting an n-type dopant, such as phosphorous or arsenic, into the semiconductor body with a relatively low dose and high energy, forms the well region 104. P-type source/drain regions 106 are formed within the well region 104. Implanting a p-type dopant, such as boron, into the well region 104 with a relatively high dose and lower energy forms the source/drain regions 106. The p-type source/drain regions can also have an extension portion or lightly doped region (LDD) between the source/drain regions and the channel.

A gate structure or stack overlies the channel and includes an oxide layer 108 and a p-type polysilicon layer 110 formed on the oxide layer 108. The oxide layer 108 (not drawn to scale) operates as a dielectric layer for the gate structure and is typically formed by a thermal growth process. The polysilicon layer 110 is formed on the oxide layer 108, after which a patterning operation is performed to form the gate structure. The polysilicon layer 110 is doped with a p-type dopant, such as boron, typically during formation of the source/drain regions 106. Sidewalls 112 are formed on lateral edges of the gate structure in order to protect the gate structure and facilitate formation of the source/drain regions 106. The sidewalls 112 can be formed by depositing an insulative material, such as nitride, oxide, or both, over the device conformally and then anisotropically etching the layer.

The device 100 operates when a sufficient voltage, referred to as a threshold voltage or greater, is applied to the polysilicon layer 110 of the gate structure. The threshold voltage generates a sufficient electric field across a channel region below the gate structure. When this happens, a conductive path is formed below the gate structure between the source/drain regions 106 allowing current to flow there between. A parameter that determines the threshold voltage is the work function the polysilicon layer 110 and the doping level in the channel region. Generally, the closer the work function is to the band edges of the silicon for the respective device types, the lower the magnitude of the threshold voltage.

A thickness of the oxide layer 108 also affects operation of the device 100. Generally, the speed, drive current, capacitance, and other functional characteristics are determined by the thickness of the oxide layer 108. Generally, the thinner the oxide layer 108, the faster the device 100 can operate and the lower the magnitude of voltage that can be tolerated. However, there are electrical and physical limitations on the extent to which thicknesses of the oxide layer 108 can be reduced. For example, very thin oxide dielectrics are prone to gate tunneling leakage currents resulting from direct tunneling through the thin gate oxide In addition, thin oxide layers provide a poor diffusion barrier to dopants.

Figure 2:
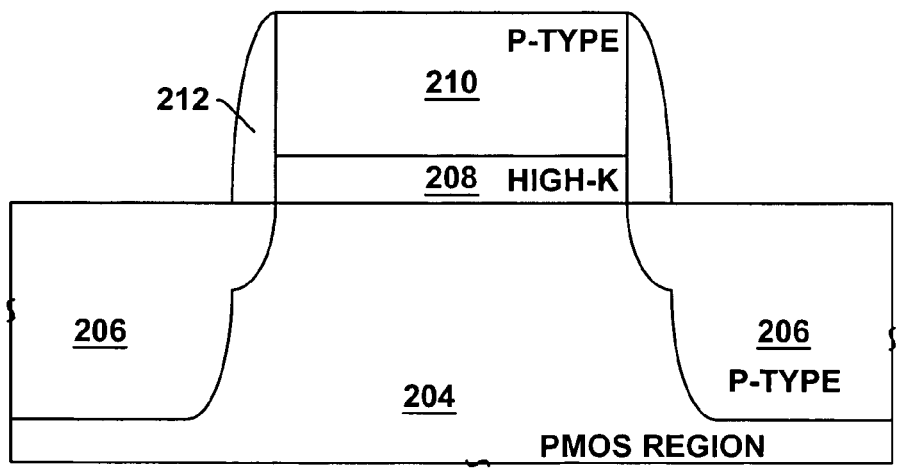
FIG. 2 is a cross sectional view of another conventional PMOS transistor device formed with a high-k dielectric layer and a p-type doped polysilicon gate.

FIG. 2 is a cross sectional view of another conventional PMOS transistor device 200 formed with a high-k dielectric layer and a p-type doped polysilicon gate. The high-k dielectric layer permits a thicker dielectric layer to be employed with the device and yet have similar electrical properties to the thinner oxide layer of the prior art FIG. 1. The high-k dielectric layer mitigates some of the problems associated with employing $SiO_2$ or SiON layers, such as, gate tunneling, leakage currents, and the like. However, employing the high-k dielectric layer with the PMOS transistor device 200 presents other problems, which are discussed below. The device 200 described below is exemplary in nature and is provided to facilitate understanding of the present invention.

The device 200 comprises an n-type well region 204 formed within a semiconductor substrate or body. Implanting an n-type dopant, such as phosphorous, into the semiconductor body with a relatively low dose and high energy, forms the well region 204. P-type source/drain regions 206 are formed within the well region 204. Implanting a p-type dopant, such as boron, into the well region 204 with a relatively high dose and lower energy forms the source/drain regions 206. The p-type source/drain regions can also have an extension portion or lightly doped region (LDD).

A gate structure or stack comprises a high-k dielectric layer 208 and a p-type polysilicon layer 210 formed on the high-k dielectric layer 208. The high-k dielectric layer 208 is formed over the device using a deposition process, such as a chemical vapor deposition process (CVD) and operates as a dielectric layer for the gate structure. The layer 208 is comprised of high-k dielectric materials that have dielectric constants greater than that of $SiO_2$ (e.g., substantially greater than about 3.9), which can be formed in a thicker layer than scaled $SiO_2$ or SiON, and yet which produce equivalent field effect performance. The polysilicon layer 210 is formed on the high-k dielectric layer 208, after which a patterning operation is performed to form the gate structure. The polysilicon layer 210 is doped with a p-type dopant, such as boron, typically during formation of the source/drain regions 206. Sidewalls 212 are formed on lateral edges of the gate structure in order to protect the gate structure and facilitate formation of the source/drain regions 206. The sidewalls 212 can be formed by depositing an insulative material, such as oxide, over the device conformally and then anisotropically etching the device.

The device 200, again, operates when a sufficient voltage, referred to as the threshold voltage, is applied to the polysilicon layer 210 of the gate structure. The threshold voltage generates a sufficient electric field across a channel region below the gate structure. When this happens, a conductive path is formed below the gate structure between the source/drain regions 206 allowing current to flow there between. A parameter that determines the threshold voltage is the work function the polysilicon layer 210, which has a concentration of p-type dopants, and the doping level in the channel region, which has a concentration of n-type dopants. Generally, the closer the work function is to the band edges of the silicon for the respective device types, the lower the magnitude of the threshold voltage.

A thickness or equivalent oxide thickness of the high-k dielectric layer 208 also affects operation of the device 200. As stated above, the speed, drive current, capacitance and other functional characteristics are a function of the thickness or equivalent oxide thickness of the high-k dielectric layer 208. Generally, the thinner the high-k dielectric layer 208, the faster the device 200 can operate and the lower the magnitude of threshold voltage that can be established.

The relative electrical performance of such high-k dielectric materials is often expressed as equivalent oxide thickness (EOT), because the high-k material layer may be thicker, while still providing the equivalent electrical effect of a much thinner layer of $SiO_2$ or SiON. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$ or SiON.

Use of high-k dielectric materials can have adverse effects on PMOS devices employed therein. As a result, device performance can be degraded. Generally, the use of high-k dielectric materials or layers for conventional PMOS devices results in an undesired offset in the threshold voltage and degraded inversion capacitance. One cause of the threshold voltage offset may be due to dopants present in high-k dielectric layers that result in high fixed charge density. This leads to unpredictable shifts or increases in threshold voltages that can be difficult to account for by counter doping the channel region, typically performed prior to gate formation in MOS devices. Inversion capacitance degradation occurs as a result of polysilicon depletion by the high-k gate dielectric layer. A p-type doped polysilicon gate layer experiences a depletion of positive charges near an interface with the high-k dielectric layer. As a result, the electric field present in the channel region is reduced. The polysilicon depletion effect causes the high-k dielectric layer to electrically function as if it were thicker than its true thickness. A contributing factor to the polysilicon depletion is that dopant concentration of p-type polysilicon gate layers is limited because p-type dopants, such as boron, tend to diffuse out of the p-type doped gate structures and thus resist higher dopant levels.

Figure 3:
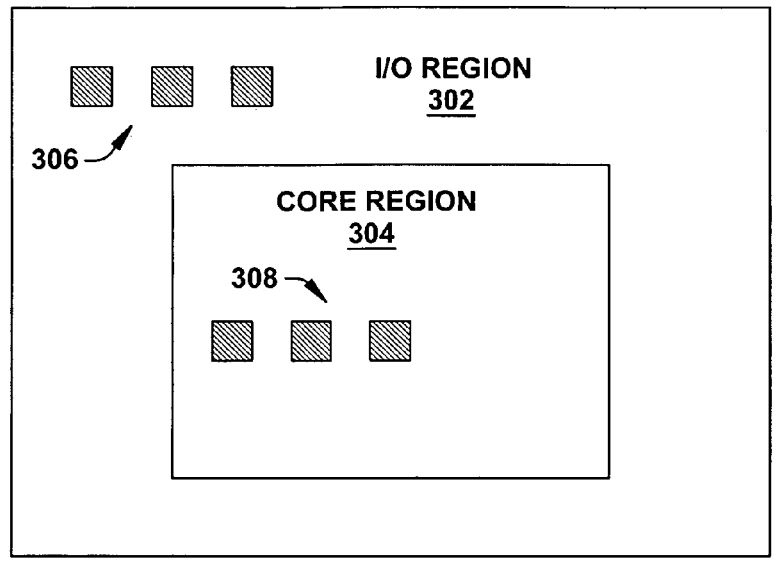
FIG. 3 is a block diagram illustrating an exemplary I/O region and an exemplary core region within a semiconductor device in accordance with an aspect of the present invention.

FIG. 3 is a block diagram illustrating an exemplary I/O region 302 and an exemplary core region 304 within a semiconductor device 300 in accordance with an aspect of the present invention. The provided diagram is exemplary in nature and is provided to facilitate understanding of the present invention.

The I/O region 302 comprises CMOS transistor devices 306, including NMOS and PMOS I/O transistor devices, which generally operate at relatively higher voltage (e.g., 1.5, 2.5, 3.3 volts) and lower speeds. The core region 304 comprises CMOS transistor devices 308, including NMOS and PMOS core transistor devices, which operate at relatively lower voltage (e.g., 1 volt) and higher speeds than the CMOS transistor devices 306 of the I/O region 302.

The I/O region 302 is generally the higher-voltage logic portion of the device 300. The I/O region 302 typically handles interfacing with external devices (data in and out of the chip), power management, voltage regulation, and the like. The transistors 306 typically, but not necessarily, operate at higher voltage than the core transistors 308 and have lower performance requirements, but are important to the overall device 300 operation.

Generally, the core region 304 can encompass low-voltage logic as well as memory functions (e.g., SRAM), including the memory array and periphery of the memory. Typically, the transistors 308 within the core region are high-performance transistors that do the bulk of the work by the device 300 and handle operations such as, calculations and the like. It is noted that memory portions of the device 300 (e.g., SRAM) can comprise both core and I/O regions.

Generally, in transistor devices, a source and drain are typically formed by adding dopants to targeted regions of a semiconductor substrate or body on either side of a channel. A gate structure is formed above the channel, having a gate dielectric or dielectric layer formed over the channel and a gate electrode above the gate dielectric. The gate dielectric is an insulator material, which prevents large currents from flowing into the channel when a voltage is applied to the gate electrode, while allowing such an applied gate voltage, also referred to as an operating voltage, to set up an electric field in the channel region in a controllable manner.

A thickness of the dielectric layer is determined by, among other things, the operating voltage and a desired speed of operation. Generally, a higher operating voltage/power requires a thicker dielectric layer. However, faster speed of operation requires a thinner dielectric layer. Accordingly, both factors can be at odds with each other.

As stated above, one type of dielectric material that is employed in transistor devices is silicon dioxide (SiO$_2$) or silicon oxynitride (SiON), which is typically formed over a silicon wafer surface. However, other dielectric materials, referred to as high-k dielectric materials can be employed to attain an equivalent oxide thickness that is smaller than its actual thickness; this is due to the dielectric constant for high-k dielectric materials being substantially larger than the dielectric constant of silicon dioxide, which is about 3.9. The dielectric constant of high-k materials is a function of the composition and amount of crystallization.

Because of the higher voltage and lower operational speeds, the I/O CMOS transistor devices 306 can have a thicker dielectric layer, expressed in terms of equivalent oxide thickness. As a result, the thicker dielectric layer can mitigate some of the problems, such as tunneling, associated with thinner dielectric layers. In contrast, the core devices 308 require relatively thin dielectric layers to permit faster operation. NMOS devices of the I/O CMOS transistor devices 306 employ a high-k dielectric material, such as hafnium silicon oxynitride, formed on an oxide or oxynitride layer whereas PMOS devices of the I/O CMOS transistor devices 306 employ silicon oxide or silicon oxynitride, which has a slightly higher dielectric constant than oxide. NMOS devices of the core transistor device 308 employ a high-k dielectric layer, and the PMOS devices of the core transistor devices employ a silicon oxide or silicon oxynitride layer. As a result, the NMOS devices benefit from employing high-k dielectric material without the PMOS devices being substantially negatively impacted.

Figure 4:
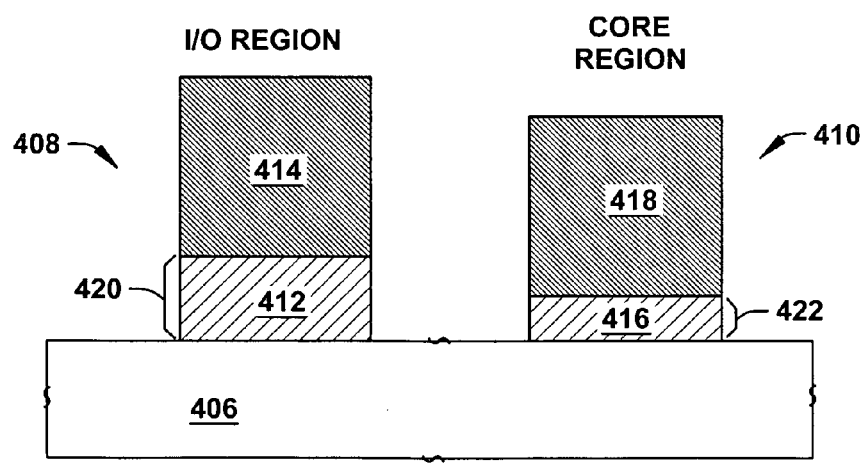
FIG. 4, a cross sectional view illustrating high and low operating voltage transistor devices in accordance with an aspect of the present invention is presented.

Turning now to FIG. 4, a cross sectional view illustrating high and low operating voltage transistor devices in accordance with an aspect of the present invention is presented. The view provided is somewhat simplified to further illustrate and compare thicknesses of dielectric layers in core and I/O regions.

A high voltage transistor device 408 is located within an I/O region and a low voltage transistor device 410 is located within a core region. The high voltage transistor device 408 has a relatively high operational voltage or applied voltage (e.g., 1.5 volts or more) whereas the low voltage transistor device 410 has a relatively low operational voltage or applied voltage (e.g., 1.0 volts).

The high voltage transistor device 408 includes a dielectric layer 412 and a gate 414. The dielectric layer 412 is comprised of a dielectric material, such as silicon dioxide, hafnium silicon oxynitride, or another suitable high-k dielectric material and has a first thickness 420, which is related to the device's operating voltage. The dielectric material varies according to whether the device 408 is a PMOS or NMOS device. Accordingly, for PMOS, the dielectric material is an silicon oxide or silicon oxynitride and for NMOS, the dielectric material is a high-k dielectric material formed on an silicon oxide or silicon oxynitride layer. The gate 414 is comprised of an electrode material, such as polysilicon, a metal or a metal compound, and is formed on the dielectric layer 412.

The low voltage transistor device 410 also includes a dielectric layer 416 and a gate 418. Again, the dielectric layer 416 is comprised of a dielectric material, such as silicon dioxide, hafnium silicon oxynitride, or another suitable high-k dielectric material, but has a second thickness 422, which is related to the device's operating voltage. The dielectric material varies according to whether the device 410 is a PMOS or NMOS device. Accordingly, for PMOS, the dielectric material is an silicon oxide or silicon oxynitride and for NMOS, the dielectric material is a high-k dielectric material. The gate 418 is comprised of an electrode material such as polysilicon or a metal or metal compound and is formed on the dielectric layer 416. Such gate is typically, but need not be the same material (and thickness) as the gate 414 for the I/O region device 408. Such gate electrode is also typically, but need not be the same material (and thickness) on the NMOS and PMOS transistors The high voltage transistor device 408 operates at a higher operating voltage (e.g., the gate voltage) than the low voltage transistor device 410. As a result, the high voltage transistor device 408 requires a thicker dielectric layer. Accordingly, the thickness (EOT) of the dielectric layer 412 for the high voltage transistor device 408, the first thickness 420, is greater than the thickness (EOT) of the dielectric layer 416 for the low voltage transistor device 410, the second thickness 422.

By permitting the dielectric layer 416 of the low voltage transistor 410 to have a relatively small thickness, the low voltage transistor device 410 can operate at higher speeds than conventionally formed devices with thicker dielectric layers.

Figure 5:
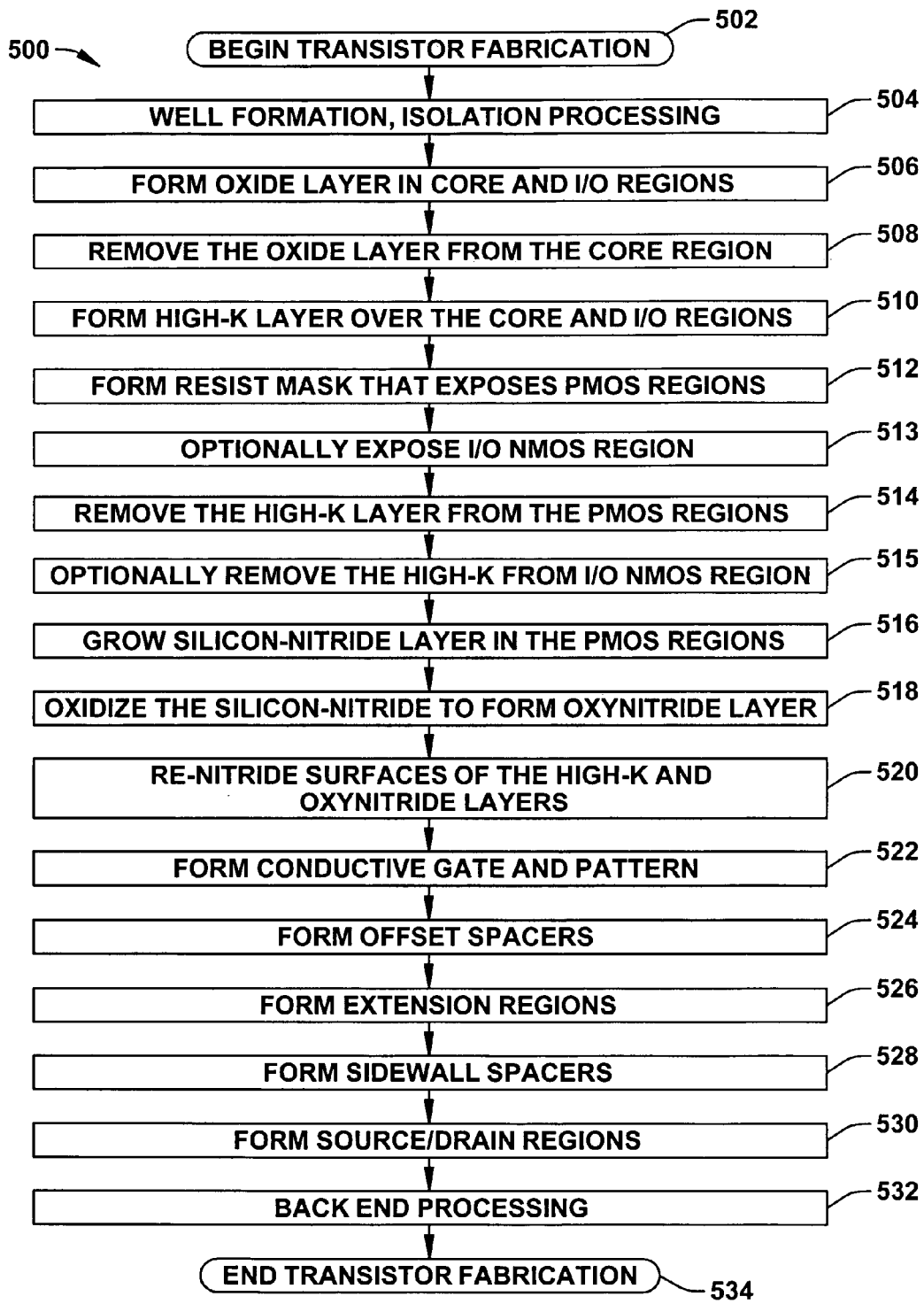
FIG. 5 is a flow diagram illustrating a method of fabricating a CMOS semiconductor device having a core region and an I/O region that mitigates damage to high-k dielectric layers in accordance with an aspect of the present invention.

FIG. 5 is a flow diagram illustrating a method 500 of fabricating a CMOS semiconductor device having a core region and an I/O region in accordance with an aspect of the present invention. The method 500 selectively employs high-k dielectric materials for dielectric layers of NMOS devices and forms silicon oxynitride for dielectric layers of PMOS devices by a low temperature thermal process, which mitigates damage, including undesired crystallization, to the high-k dielectric layer.

While the exemplary method 500 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 500 begins at block 502, wherein transistor fabrication is initiated, and transistor well formation and isolation processing is performed at block 504 thereby defining NMOS and PMOS regions within core and I/O regions of a semiconductor substrate, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another. The semiconductor substrate is comprised of a semiconductor material, such as silicon or germanium, and can also include silicon on insulator (SOI) substrates, such as, Si/SiGe, and Si/SiGe/Si.

The method 500 continues at block 506, wherein an oxide (SiO$_2$) layer is formed over devices within both the core and I/O regions. In one example, the oxide layer comprises a thin, thermally grown silicon dioxide layer. It is appreciated that alternate variations of the method 500 contemplate forming an oxynitride layer (SiON) in place of the oxide layer. Subsequently, the oxide layer is patterned at block 508 in order to remove the oxide layer from the core region while retaining the oxide layer in the I/O region.

Continuing, a high-k dielectric layer is formed over the device at block 510 in a blanket operation in both the core and I/O regions. The high-k dielectric layer is formed by depositing a suitable high-k material, such as hafnium silicate (HfSiO), having a dielectric constant substantially greater than 3.9. Additionally, nitrogen (N) may be introduced during the formation of the high-k dielectric layer or can be added subsequently in a nitridation process. An example of suitable procedures to form the high-k dielectric layer is provided below.

Prior to deposition of the high-k dielectric material, a suitable surface preparation is typically performed. The surface preparation step might include the growth of an ultra-thin silicon dioxide or silicon oxynitride layer with a thickness of one to six monolayers. Unlike oxide and oxynitride, which may be formed by thermal oxidation (growth process), the high-k dielectric layer is formed by depositing a high-k dielectric material over the device, using chemical vapor deposition (CVD), physical vapor deposition (PVD), atomic layer deposition (ALD), molecular beam epitaxy (MBE), or other suitable deposition processes. The deposition process is performed so as to result in a thickness that results in a desired or selected equivalent oxide thickness (EOT). As stated above, high-k dielectric materials have dielectric constants that are greater than that of oxide (e.g., substantially greater than about 3.9). As a result, the high-k dielectric layer can be formed in a thicker layer than scaled oxide, and yet produce equivalent field effect performance. The relative electrical performance of such high-k dielectric materials is often expressed as EOT, because the high-k material layer may be thicker, while still providing the equivalent electrical effect of a much thinner layer of oxide. Since the dielectric constant "k" is higher than silicon dioxide, a thicker high-k dielectric layer can be employed to mitigate tunneling leakage currents, while still achieving the equivalent electrical performance of a thinner layer of thermally grown oxide.

Any suitable dielectric may be deposited at block 510 having a dielectric constant higher than that of SiO$_2$, including but not limited to binary metal oxides including aluminum oxide (Al$_2$O$_3$), zirconium oxide (ZrO$_2$), hafnium oxide (HfO$_2$), lanthanum oxide (La$_2$O$_3$), yttrium oxide (Y$_2$O$_3$), titanium oxide (TiO$_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

Continuing at block 512, a photoresist mask is formed over the device that covers NMOS regions in the core and I/O regions, but exposes the PMOS regions in the core and I/O regions. The photoresist mask can optionally be modified or adjusted to also expose the I/O NMOS region at block 513. The exposure of the I/O NMOS region may be done if the high-k dielectric layer yields an EOT greater than a desired EOT already provided solely by the oxide layer.

The high-k dielectric layer is removed from PMOS regions of the core and I/O regions at block 514. A suitable high-k strip process can be employed that is selective to the oxide layer present within the I/O region and the underlying substrate within the core region. The photoresist mask is also then removed by employing a strip procedure that is selective to the high-k layer. The high-k dielectric layer can optionally be removed from the I/O NMOS region at block 515. Typically, the removal is performed in conjunction with the removal performed at block 514.

Subsequently, silicon nitride is grown in the PMOS regions of the core and I/O regions at block 516. The silicon nitride formed within the PMOS region of the I/O region is formed on oxide and, as a result, forms into silicon oxynitride. The silicon nitride growth process is performed at a relatively low temperature (e.g., 700 to 800 degrees Celsius) along with a nitrogen source such as ammonia. In contrast, oxide growth processes are typically performed at temperatures of at least 1000 degrees Celsius. The low temperature employed in the silicon nitride growth process reduces or mitigates undesired crystallization of the high-k dielectric layer. In contrast, silicon dioxide growth at this point could result in undesired crystallization, form silicon dioxide at interfaces between the high-k dielectric layer and underlying substrate, and the like, which are mitigated or prevented by employing the low temperature silicon nitride growth process. It is also noted that the high-k layer may also be nitrided during this growth process.

The grown silicon nitride layer is oxidized at block 518 to form a silicon oxynitride layer. As a result, the silicon oxynitride layer is present in PMOS regions of the core and I/O regions. This oxidation process can improve/increase mobility by removing or reducing nitrogen from an interface between the silicon oxynitride layer and underlying substrate. The oxidation process can be thermal, such as with oxygen ($O_2$) or nitrous oxide ($N_2O$), blanket plasma oxidation, or liquid based, such as with ozonated water or hydrogen peroxide.

The high-k dielectric layer and the silicon oxynitride layer are re-nitrided at block 520 by performing another nitridation process. Typically, a thermal or plasma nitridation process is employed. Nitridation of the high-k dielectric layer inhibits dopant diffusion, thermally stabilizes the deposited dielectric materials making it more resistant to crystallization, and causes the high-k dielectric layer to be less resistant to standard etch chemistries.

A multi-step annealing process can, optionally, be performed to facilitate the performance and operation of the high-k dielectric layer, the oxide layer, and the second oxide layer and the transistor devices in the core and I/O regions that employ the layers. These layers can be subjected to one or more non-oxidizing anneals to densify the dielectric material and one or more oxidizing anneals to mitigate material defects.

An example of a suitable multi-step annealing process that can be employed with the method shown in FIG. 5 follows. A multi-step process is performed including one or more pre-nitridation anneals, a nitridation process, and one or more post-nitridation anneals. The multi-step process may advantageously comprise first and second pre-nitridation anneals, wherein a first anneal is performed at a moderate temperature in an inert non-oxidizing ambient for densifying the deposited high-k material, as well as a second pre-nitridation anneal that is performed in an oxidizing ambient for curing defects and eliminating impurities. Moreover, the post-nitridation annealing can advantageously include a third anneal performed at a high temperature in a non-oxidizing ambient to densify the thermally stabilized high-k material and a fourth anneal in an oxidizing ambient to reduce any remaining defects and impurities.

Dielectric characteristics of NMOS devices within the core region are a function of the composition and thickness of the high-k dielectric layer. Dielectric characteristics of PMOS devices within the core region are a function of the thickness of the silicon oxynitride layer. This is the nitride layer that is then oxidized to form silicon oxynitride. Dielectric characteristics of NMOS devices within the I/O region are a function of the composition and thickness of the high-k dielectric layer and the first oxide layer. Dielectric characteristics of PMOS devices within the I/O region are a function of the thickness of the nitrided layer and the first oxide layer.

A conductive gate layer is then deposited over the device at block 522 and patterned to form a conductive gate electrode in PMOS and NMOS regions of the core and I/O regions. As an example, a polysilicon layer may be deposited via chemical vapor deposition (CVD) and patterned via etching to form gate electrodes in both NMOS and PMOS regions, respectively. However, other types of conductive materials, such as a metal or metal compound, can also be employed in accordance with the present invention.

An offset spacer is then formed on lateral edges of the conductive gate electrodes at block 524. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at block 526 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. An n-type dopant (e.g., phosphorous) can be implanted with a low energy into the NMOS region to form NMOS extension regions. Similarly, a p-type dopant (e.g., boron) can be implanted with a low energy into the PMOS region to form PMOS extension regions. A thermal process such as a rapid thermal anneal can then be employed to activate the extension region dopants, which causes the extension regions to diffuse laterally slightly underneath the offset spacer toward the channels.

Still referring to FIG. 5, sidewall spacers are then formed on the gate structures at block 528. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Source/drain regions are then formed in the NMOS and PMOS regions of the core and I/O regions at block 530. Source/drain regions are formed within the NMOS regions by masking the PMOS regions with a resist mask, exposing the NMOS regions, and implanting n-type dopant(s) (e.g., phosphorous). Similarly, source/drain regions are formed within the PMOS regions by masking the NMOS regions with a resist mask, exposing the PMOS regions, and implanting p-type dopant(s) (e.g., boron). The source/drain dopant is introduced into the exposed areas (top of gate electrode and active areas not covered by the sidewall spacers).

Subsequently, other features and/or components of the device can be formed at block 532 ending fabrication at block 534. Conductive contacts can be formed through a PMD layer and portions of the stress inducing liner to provide electrical connection for the transistor terminals. Generally, contact formation comprises forming openings in the PMD layer through suitable masking and etching processes, followed by deposition of conductive material (e.g., tungsten or other suitable materials), and subsequent planarization (e.g., chemical mechanical polishing, etc.). One or more metallization levels are layers can then be formed to provide electrical interconnection of the various electrical components in the device, wherein each metallization level includes an inter-level or inter-layer (ILD) dielectric formed over a preceding level, with vias and/or trenches formed therein and filled with a conductive material. Other typical back-end processing may be performed including hydrogen sintering and other processes that impact stress induced by the strain inducing liner.

It is noted that the method 500 is discussed in terms of core and I/O regions in order to facilitate a better understanding of the present invention. However, the present invention is applicable to two or more regions that have varying requirements for dielectric thickness due to operational requirements including speed and/or voltage levels. Also, the regions can individually comprise memory, logic, or combinations thereof.

Figure 6A:
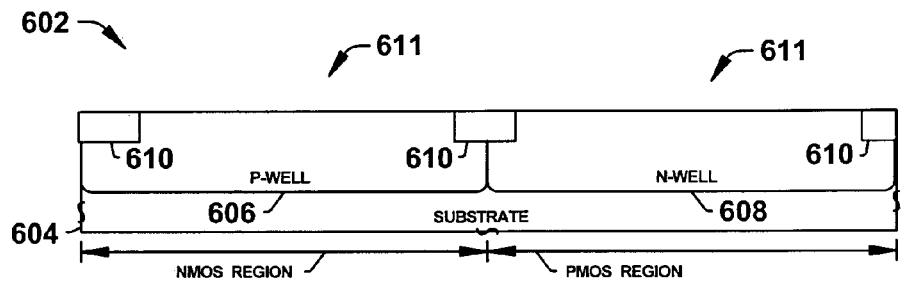
FIGS. 6A-6R are a plurality of fragmentary cross section diagrams illustrating a transistor device having core and I/O regions and being formed in accordance with the present invention by the method of FIG. 5.
Figure 6B:
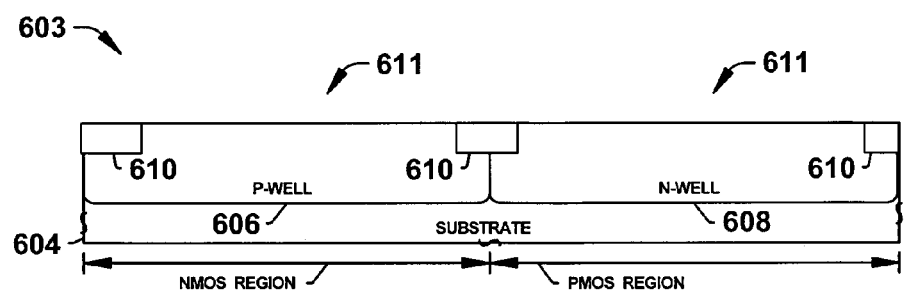
Figure 6C:
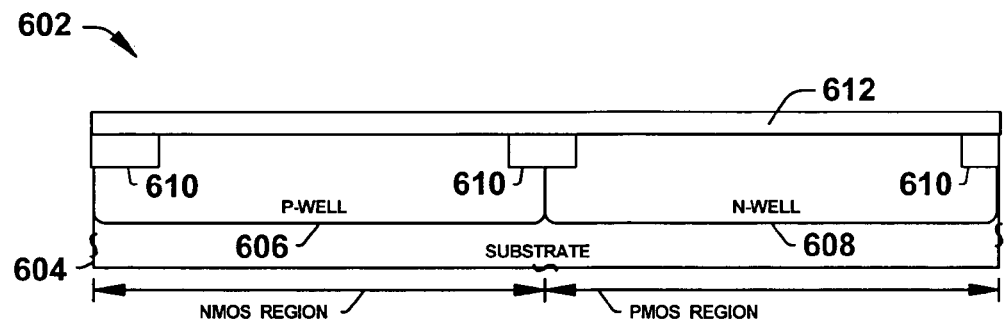
Figure 6D:
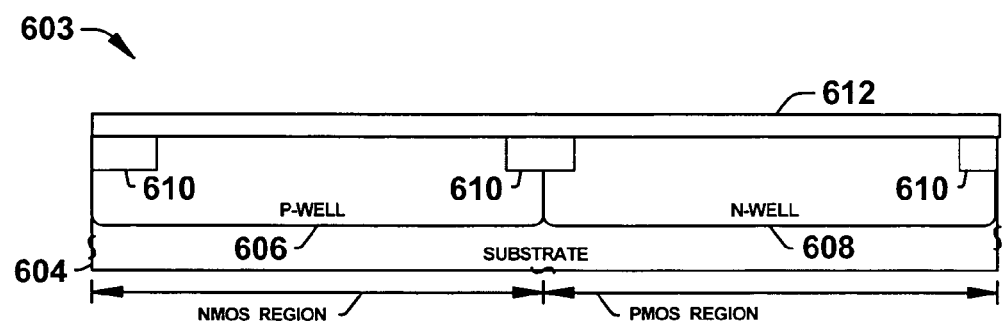
Figure 6E:
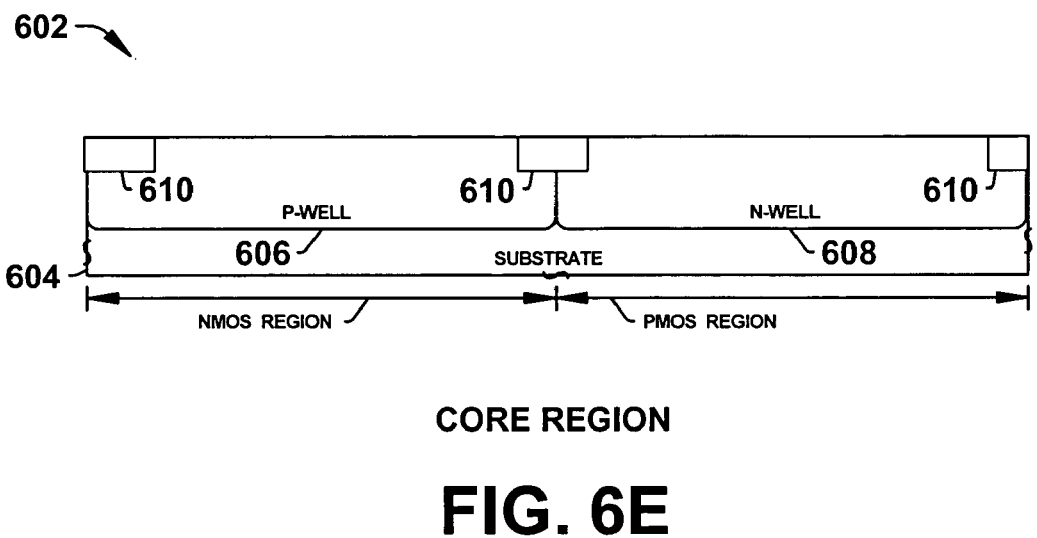
Figure 6F:
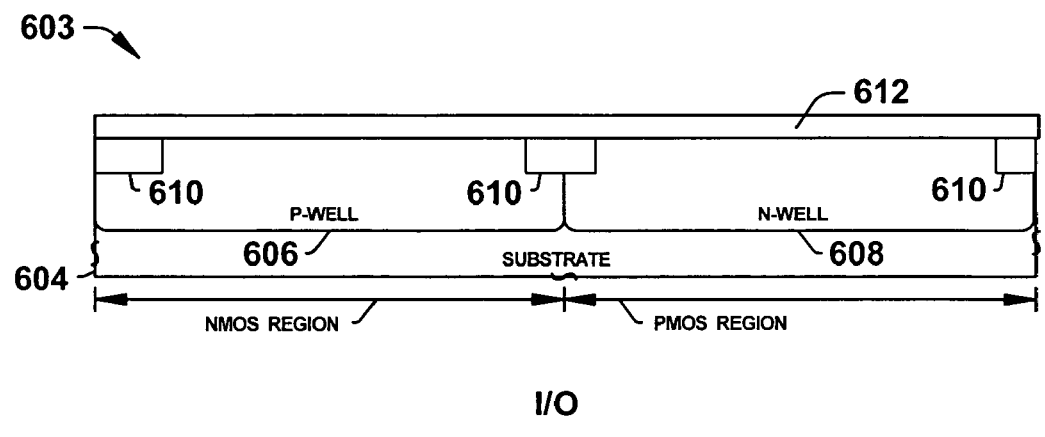
Figure 6G:
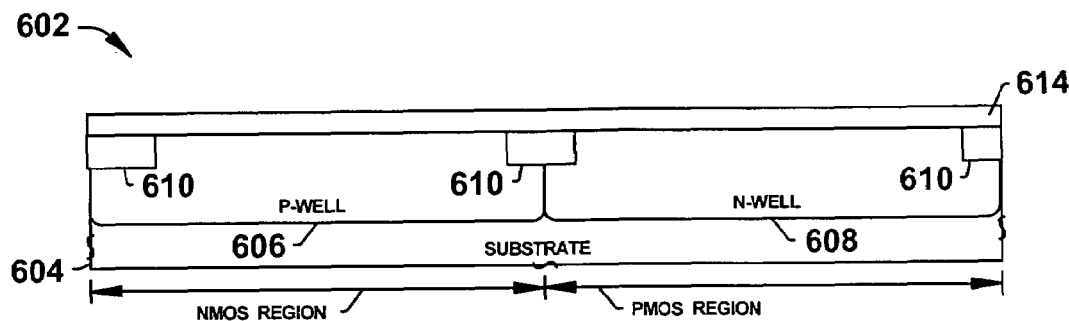
Figure 6H:
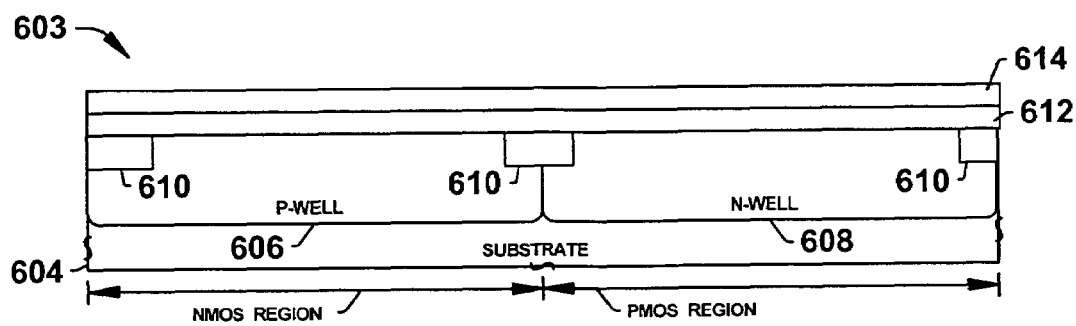
Figure 6I:
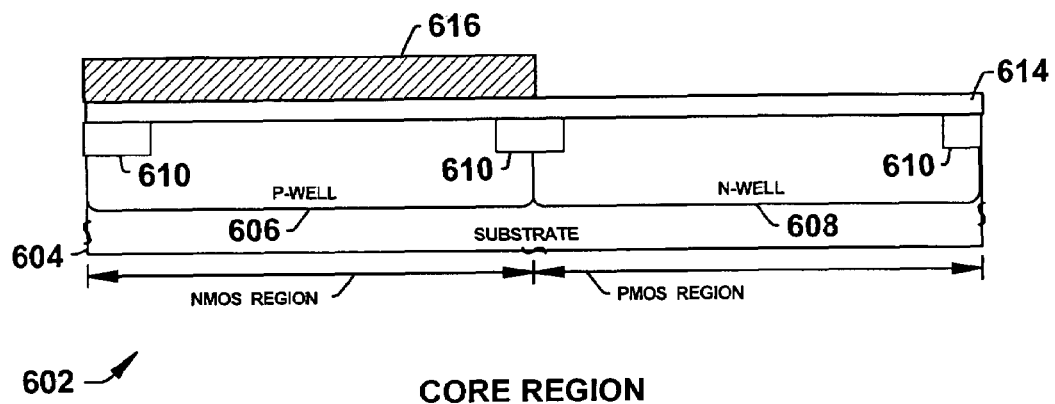
Figure 6J:
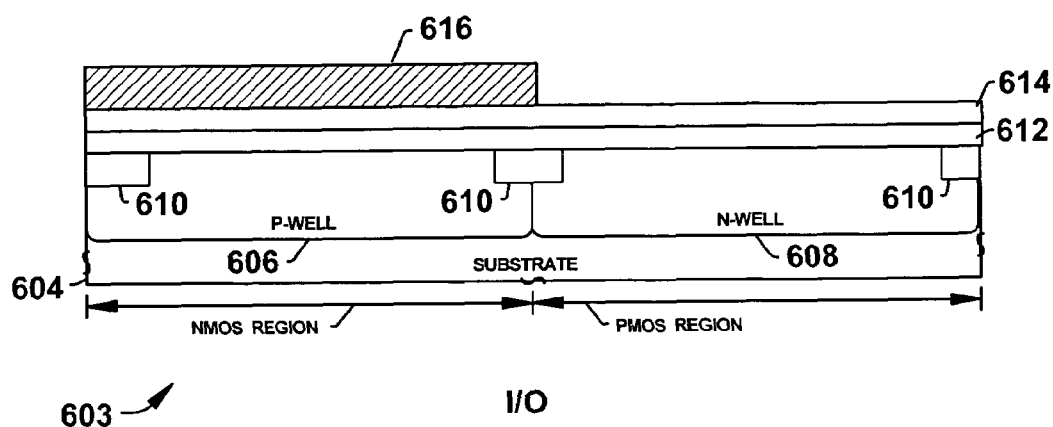
Figure 6K:
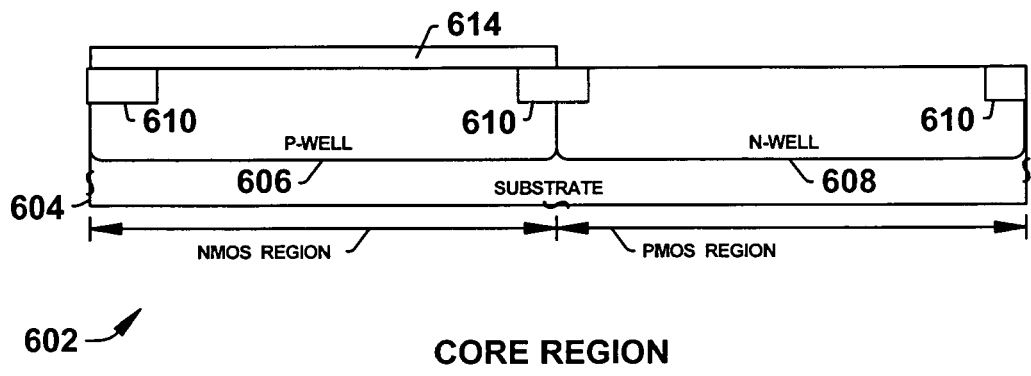
Figure 6L:
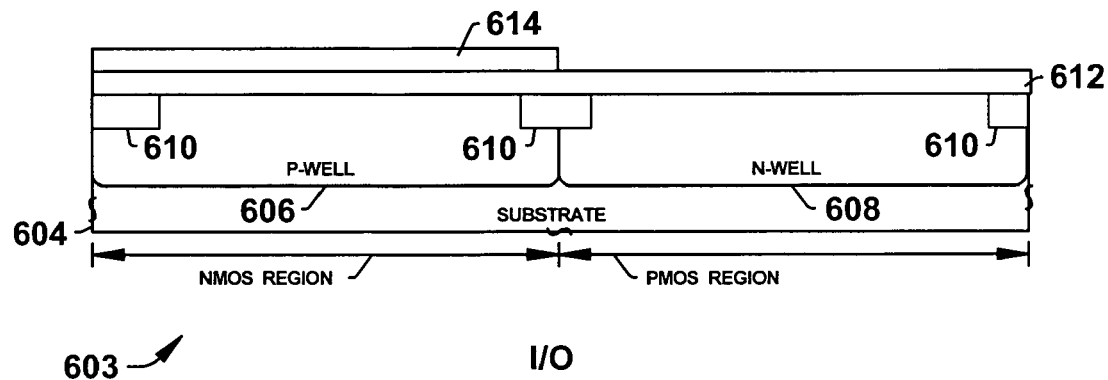
Figure 6M:
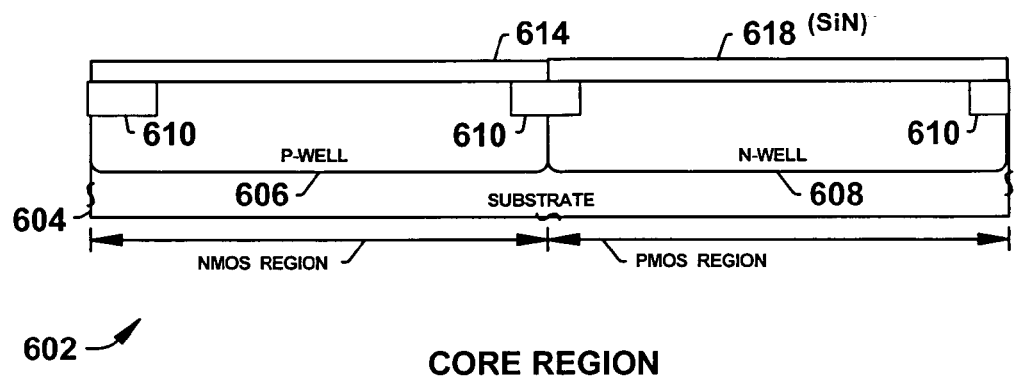
Figure 6N:
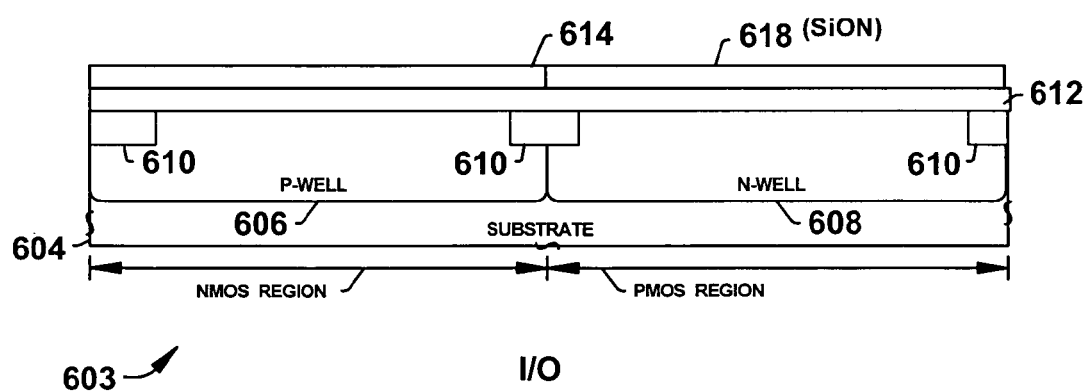
Figure 6O:
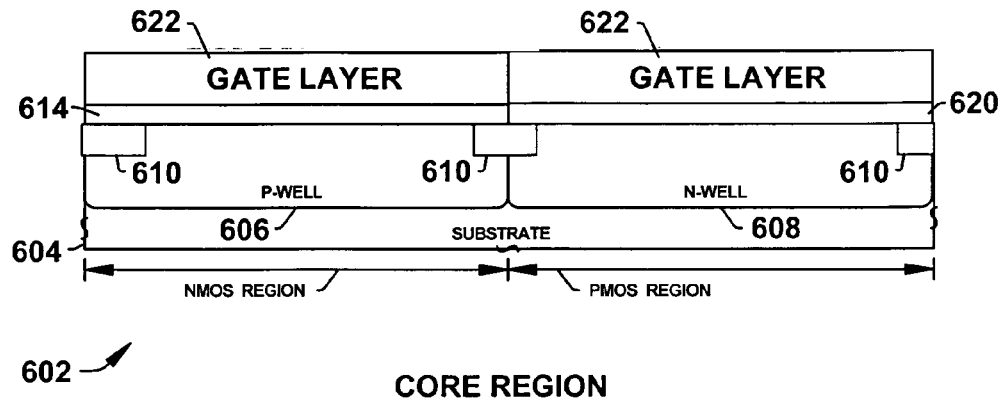
Figure 6P:
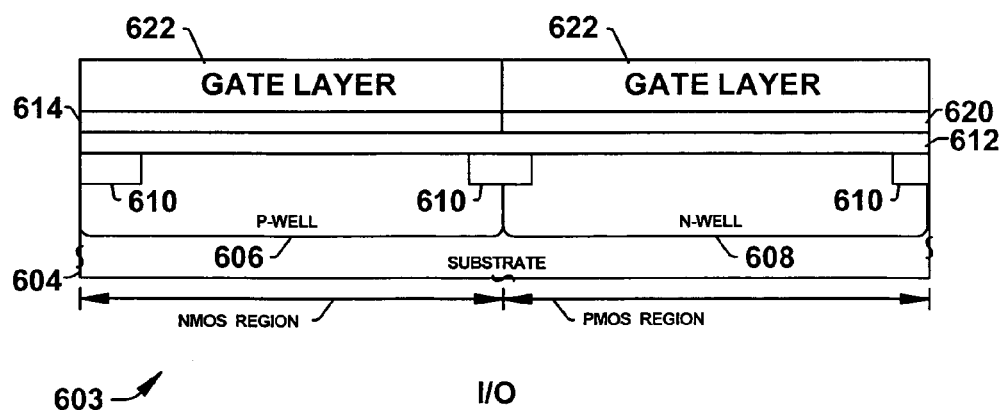
Figure 6Q:
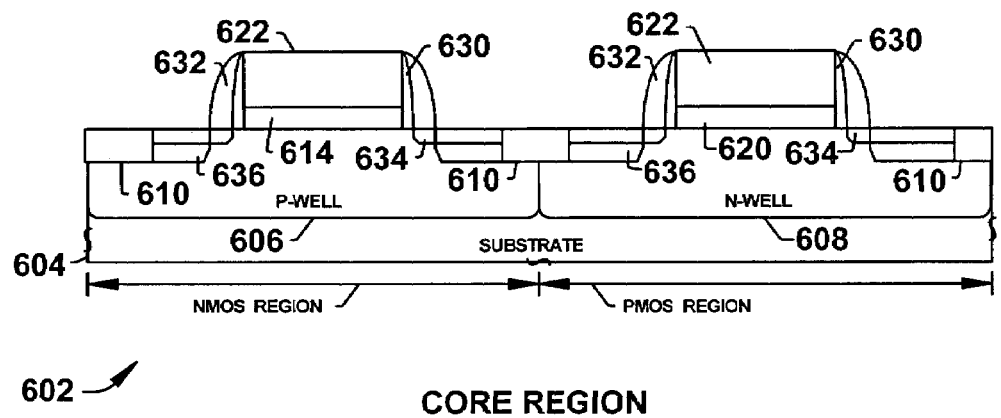
Figure 6R:
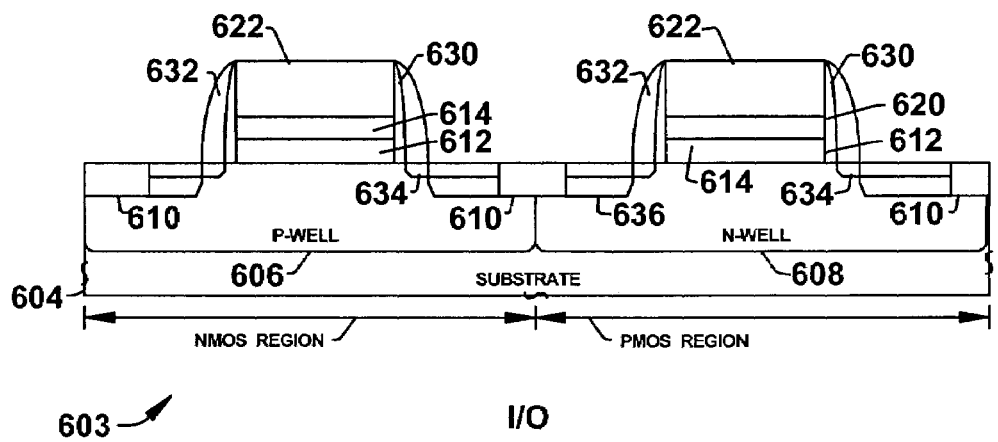

Turning now to FIGS. 6A-6R, a plurality of fragmentary cross section diagrams illustrating a transistor device having core and I/O regions and being formed in accordance with the present invention by the method 500 of FIG. 5 is provided. In FIGS. 6A and 6B, a transistor device is provided, wherein a semiconductor body 604, such as a semiconductor substrate, has a number of wells formed therein, such as a P-well region 606 to define an NMOS transistor device region and an N-well region 608 to define a PMOS transistor device region, respectively. The semiconductor body 604 can comprise semiconductor materials, such as silicon, and germanium, and also can comprise silicon on insulators (SOI). A core region 602 is illustrated in FIG. 6A and an I/O region 603 is illustrated in FIG. 6B. Furthermore, isolation regions 610 such as STI regions are formed in the semiconductor body to define active area regions 611, as may be appreciated.

In FIGS. 6C and 6D, the transistor device is illustrated, wherein an oxide layer 612 has been formed over the device. The oxide layer 612 is typically grown to a suitable thickness, which is a function of operational characteristics for transistor devices within the I/O region 603. FIGS. 6E and 6F depict removal of the oxide layer 612 from the core region 602. The oxide layer 612 is now only present within the I/O region 603.

A high-k dielectric layer 614 is formed over the device as shown in FIGS. 6G and 6H. In the core region 602 of FIG. 6G, the high-k dielectric layer 614 is substantially formed on the well regions 606 and 608. In the I/O region 603 of FIG. 6H, the high-k dielectric layer 614 is formed on the oxide layer 612.

FIGS. 6I and 6J depict the device after formation of a photoresist mask 616. The mask 616 covers the NMOS regions in the core region 602 and the I/O region 603, but exposes the PMOS regions. An etch process selective to the oxide layer 612 and the substrate 604 is performed that removes the high-k dielectric layer 614 from the PMOS regions. The high-k dielectric layer can also be optionally removed from the I/O NMOS regions. Subsequently, the photoresist mask 616 is removed. FIGS. 6K and 6L depict the core region 602 and the I/O region 603 after etching and removal of the photoresist mask.

A silicon nitride layer 618 is grown in PMOS regions of the core and I/O regions as shown in FIGS. 6M and 6N. The silicon nitride layer 618 formed within the PMOS region of the I/O region is formed on oxide and, as a result, is at least partially comprised of silicon oxynitride, as shown in FIG. 6N. The silicon nitride growth process is a relatively low temperature process and is typically at least 200 to 300 degrees Celsius lower than a typical silicon dioxide growth process. Typically, a chamber is employed and brought to a suitable temperature (e.g., 700 degrees Celsius) and a nitrogen source, such as ammonia, is provided within the chamber thereby causing silicon nitride to grow from the silicon substrate/body within the n-well regions 608. This process can be thermal in nature, or a plasma process or a combination, and it can also involve light (UV) stimulation. The high-k layer 614 is typically nitrided during this process.

Subsequently, the silicon nitride layer 618 is oxidized to convert the layer 618 into a silicon oxynitride layer 620 (shown in FIGS. 6O and 6P). This oxidation can increase mobility by removing and/or reducing nitrogen from interfaces of the silicon oxynitride layer 620. The oxidation process can be thermal, plasma, or liquid based. After oxidation, a re-nitridation process is typically performed in order to obtain desired nitrogen levels or concentrations within the high-k dielectric layer 614 and the silicon oxynitride layer 620. The presence of nitrogen within the high-k dielectric layer 614 can mitigate crystallization and permit higher temperature thermal processes to be performed.

Dielectric characteristics for NMOS devices within the core region 602 are a function of thickness and composition of the high-k dielectric layer 614. Dielectric characteristics for PMOS devices within the core region 602 are a function of thickness and composition of the silicon oxynitride layer 620. Dielectric characteristics for NMOS devices within the I/O region 603 are a function of the thickness and composition of the high-k dielectric layer 614 and the oxide layer 612. Dielectric characteristics for PMOS devices within the I/O region 603 are a function of the thickness and composition of the oxide layer 612 and the silicon oxynitride layer 620.

Thereafter, a conductive gate electrode material is deposited over the device and patterned as shown in FIGS. 6O and 6P to form a gate layer 622 in both the core and I/O regions. The gate electrode material is a conductive material such as polysilicon, metal or metal compound. If polysilicon is employed, it can be doped or undoped at this stage in the flow.

FIG. 6Q depicts the core region 602 of the device after formation of source/drain regions 636 and FIG. 6R depicts the I/O region 603 of the device after formation of the source/drain regions 636. After formation of the gate layer 622, the layers are patterned to form gate structures, as described above. Then, offset spacers 630 are formed on lateral edges of the gate structures. The offset spacers serve to align an extension region implant that forms extension regions 634. Afterward, sidewall spacers 632 are formed on the lateral edges of the gate structures adjacent to the offset spacers 630. Continuing, the source/drain regions 636 are formed within the NMOS and PMOS regions by implanting n-type and p-type dopants, respectively.

It is noted that the semiconductor device depicted in FIGS. 6A to 6R is exemplary in nature and intended to facilitate an understanding of the present invention. It is appreciated that variations in thicknesses, layers formed, dimensions, materials employed, and the like are permitted and contemplated in accordance with the present invention.

Figure 7:
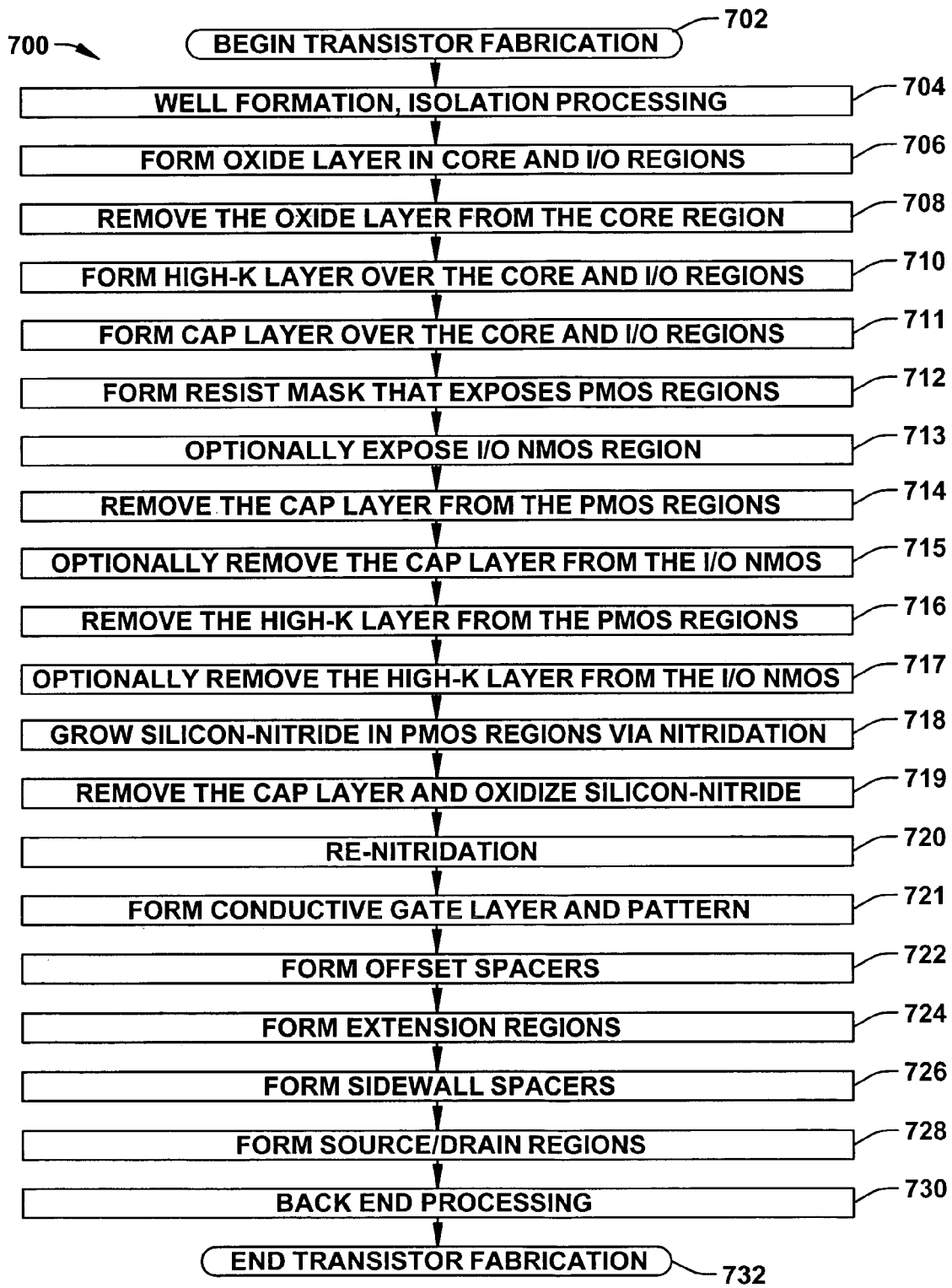
FIG. 7 is a flow diagram illustrating a method of fabricating a CMOS semiconductor device having a core region and an I/O region that employs a cap layer in accordance with an aspect of the present invention.

FIG. 7 is a flow diagram illustrating a method 700 of fabricating a CMOS semiconductor device having a core region and an I/O region that employs a cap layer and grows silicon nitride in accordance with an aspect of the present invention. The method 700 selectively employs high-k dielectric materials for dielectric layers of NMOS devices, but employs silicon oxynitride for dielectric layers of PMOS devices thereby mitigating or avoiding problems resulting from employing high-k dielectrics with PMOS devices. The silicon oxynitride is formed via low temperature thermal processes that mitigate thermal damage, including undesired crystallization, of the high-k dielectric layer. The cap layer facilitates patterning of high-k dielectric layers and protects underlying layers during stripping and/or etching processes.

While the exemplary method 700 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 700 is similar to the method 500 described in FIG. 5. As a result, some details are omitted and can be obtained from the description of the method 500 of FIG. 5.

The method 700 begins at block 702, wherein transistor fabrication is initiated, and transistor well formation and isolation processing is performed at block 704 thereby defining NMOS and PMOS regions within core and I/O regions of a semiconductor body or substrate, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another. The semiconductor body can comprise a semiconductor material and/or an SOI, as described supra.

The method 700 continues at block 706, wherein a first oxide layer is formed over devices within both the core and I/O regions. In one example, the oxide layer comprises a thin, thermally grown silicon dioxide layer. Subsequently, the oxide layer is patterned at block 708 in order to remove the oxide layer from the core region while retaining the oxide layer in the I/O region. It is appreciated that variations of the method 700 include employing a silicon oxynitride layer in place of the oxide layer formed at block 706.

Continuing, a high-k dielectric layer is formed over the device at block 710 in a blanket operation in both the core and I/O regions. The high-k dielectric layer is formed by depositing a suitable high-k material, such as HfSiON, having a dielectric constant greater or substantially greater than 3.9. Additionally, nitrogen (N) may be introduced during the formation of the high-k dielectric layer or can be added subsequently in a nitridation process. An example of suitable procedures to form the high-k dielectric layer is provided above with respect to FIG. 5.

Any suitable dielectric may be deposited at block 710 having a dielectric constant higher than that of $SiO_2$, including but not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

A cap layer is formed over the device on the high-k dielectric layer at block 711. The cap layer protects the underlying layers and permits greater flexibility for performing later strip and etch processes. The cap layer is formed by a deposition process, such as a CVD deposition process, that deposits and forms a suitable material such as, polysilicon, SiGe, Ge, silicon nitride ($Si_3N_4$), silicon carbide (SiC) or carbon-doped $SiO_2$ (SiOC).

Continuing at block 712, a photoresist mask is formed over the device that covers NMOS regions in the core and I/O regions, but exposes the PMOS regions in the core and I/O regions. The I/O NMOS region can also optionally be exposed at block 713 via the photoresist mask. This may be done, for example, if the high-k dielectric layer yields an EOT greater than a desired EOT already provided solely by the oxide layer.

At block 714, the exposed portions of the cap layer within the PMOS regions are removed via a patterning process. As a result, the high-k dielectric layer within the PMOS regions of the core and I/O regions is now exposed. The cap layer within the I/O NMOS region can optionally be removed at block 715 if the region was exposed at block 713, thereby also exposing the high-k dielectric layer within the I/O NMOS region.

The high-k dielectric layer is then removed from PMOS regions of the core and I/O regions at block 716. A suitable high-k strip process can be employed that is selective to the oxide layer present within the I/O region and the underlying substrate within the core region. The photoresist mask is also then removed by employing a strip procedure that is selective to the high-k layer and the cap layer. Additionally, the high-k dielectric layer can optionally be removed from the I/O NMOS region at block 717 if the cap layer within the I/O NMOS region was removed at block 715.

A silicon nitride layer is grown in PMOS regions of the core and I/O regions at block 718. The silicon nitride layer formed within the PMOS region of the I/O region is formed on oxide and, as a result, is at least partially comprised of silicon oxynitride. The silicon nitride growth process is a relatively low temperature process and is typically at least 200 to 300 degrees Celsius below a standard silicon dioxide growth process. In one example, a chamber is employed and brought to a suitable temperature (e.g., 700 degrees Celsius) and a nitrogen source, such as ammonia, is provided within the chamber thereby causing silicon nitride to grow from the silicon substrate/body within the n-well regions. This process can be thermal in nature, or a plasma process or a combination, and it can also involve light (e.g. UV) stimulation. The high-k layer is protected from exposure to this process by the capping layer.

The cap layer is stripped at block 719 thereby removing the remaining portions of the cap layer from the NMOS regions of the core and I/O regions and an oxidation process is performed. A suitable strip/etch process is employed that is selective to oxide and the high-k dielectric material in order to remove the cap layer. The oxidation process oxidizes the silicon nitride layer into a silicon oxynitride layer and can increase mobility by removing and/or reducing nitrogen from interfaces of the silicon oxynitride layer. The oxidation process can be thermal, plasma, or liquid based as described supra.

The high-k dielectric layer and the silicon oxynitride layer are re-nitrided at block 720 in order to adjust nitrogen levels/concentrations. Typically, a thermal or plasma nitridation process is employed. Nitridation of the high-k dielectric layer inhibits dopant diffusion and thermally stabilizes the deposited dielectric materials and causes the high-k dielectric layer to be less resistant to standard etch chemistries.

A multi-step annealing process can, optionally, be performed to facilitate the performance and operation of the high-k dielectric layer, the oxide layer, and the second oxide layer and the transistor devices in the core and I/O regions that employ the layers. These layers can be subjected to one or more non-oxidizing anneals to densify the dielectric material and one or more oxidizing anneals to mitigate material defects.

The method 700 describes removing the remaining portions of the cap layer at block 719. However, it is appreciated that the cap layer can be removed at other times within the method such that the high-k dielectric layer is protected from processing that forms the silicon-nitride at block 718. For example, the cap layer can be removed after oxidation of the nitride layer or after the re-nitridation at block 720.

A conductive gate layer is then deposited over the device at block 721 and patterned to form conductive gate electrodes in PMOS and NMOS regions of the core and I/O regions. The gate layer comprises a conductive material such as polysilicon, a metal, or metal compound. As an example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at block 722. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at block 724 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Still referring to FIG. 7, sidewall spacers are then formed on the gate structures at block 726. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Source/drain regions are then formed in the NMOS and PMOS regions of the core and I/O regions at block 728. Source/drain regions are formed within the NMOS regions by masking the PMOS regions with a resist mask, exposing the NMOS regions, and implanting n-type dopants (e.g., phosphorous). Similarly, source/drain regions are formed within the PMOS regions by masking the NMOS regions with a resist mask, exposing the PMOS regions, and implanting p-type dopants (e.g., boron). The source/drain dopant is introduced into the exposed areas (top of gate electrode and active areas not covered by the sidewall spacers).

Subsequently, other features and/or components of the device can be formed at block 730 ending fabrication at block 732. Conductive contacts can be formed through a PMD layer and portions of the stress inducing liner to provide electrical connection for the transistor terminals. Generally, contact formation comprises forming openings in the PMD layer through suitable masking and etching processes, followed by deposition of conductive material (e.g., tungsten or other suitable materials), and subsequent planarization (e.g., chemical mechanical polishing, etc.). One or more metallization levels are layers can then be formed to provide electrical interconnection of the various electrical components in the device, wherein each metallization level includes an inter-level or inter-layer (ILD) dielectric formed over a preceding level, with vias and/or trenches formed therein and filled with a conductive material. Other typical back-end processing may be performed including hydrogen sintering and other processes that impact stress induced by the strain inducing liner.

Turning now to FIGS. 8A-8D, a plurality of fragmentary cross section diagrams illustrating a transistor device having core and I/O regions and being formed in accordance with the present invention by the method 700 of FIG. 7 is provided. The cross sections depict formation and patterning of the cap layer in order to facilitate selective removal of a high-k dielectric layer from PMOS regions of the device prior to growing a silicon nitride layer. A limited number of cross sections are provided to illustrate the cap layer. The cross section figures of FIGS. 6A-6R can be referenced for additional detail.

Figure 8A:
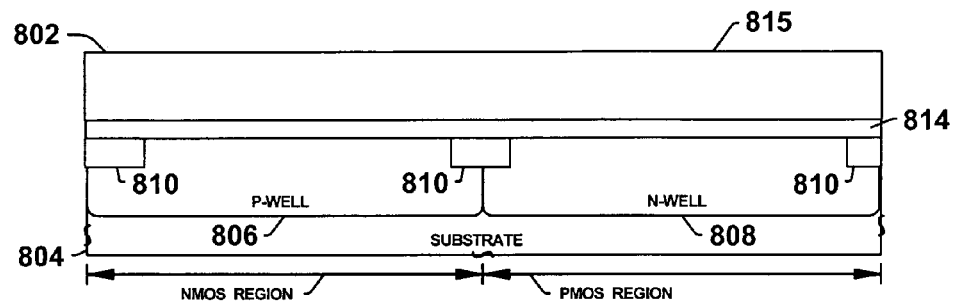
FIGS. 8A-8D are a plurality of fragmentary cross section diagrams illustrating a transistor device having core and I/O regions and being formed in accordance with the present invention by the method of FIG. 7.
Figure 8B:
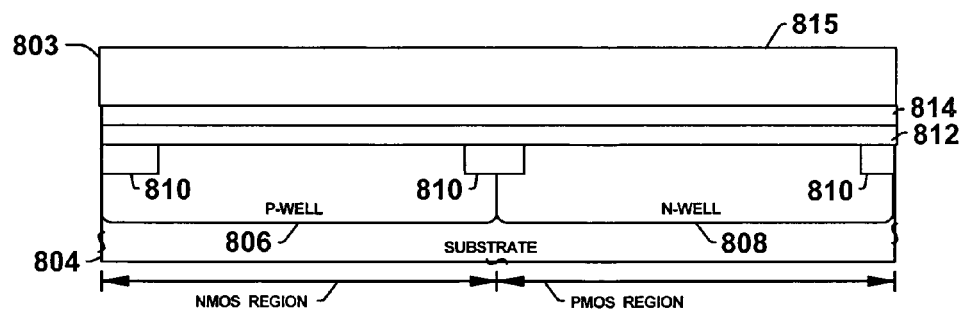

In FIGS. 8A and 8B, a transistor device is provided, wherein a semiconductor body 804, such as a semiconductor substrate, has a number of wells formed therein, such as a P-well region 806 to define an NMOS transistor device region and an N-well region 808 to define a PMOS transistor device region, respectively. A core region 802 is illustrated in FIG. 8A and an I/O region 803 is illustrated in FIG. 8B. Furthermore, isolation regions 810 such as STI regions are formed in the semiconductor body to define active area regions. An oxide layer 812 is formed over the device and patterned to be removed from the core region 802 such that it remains in only the I/O region 803, as shown in FIG. 8B. A high-k dielectric layer 814 is formed over the device and is formed on the semiconductor body 804 as shown in FIG. 8A. The high-k dielectric layer 814 is formed on the oxide layer 812 in the I/O region as shown in FIG. 8B. A cap layer 815 comprised of poly silicon or silicon nitride ($Si_3N_4$) is formed over the device and on the high-k dielectric layer 814 in both the core region 802 and the I/O region 803.

Figure 8C:
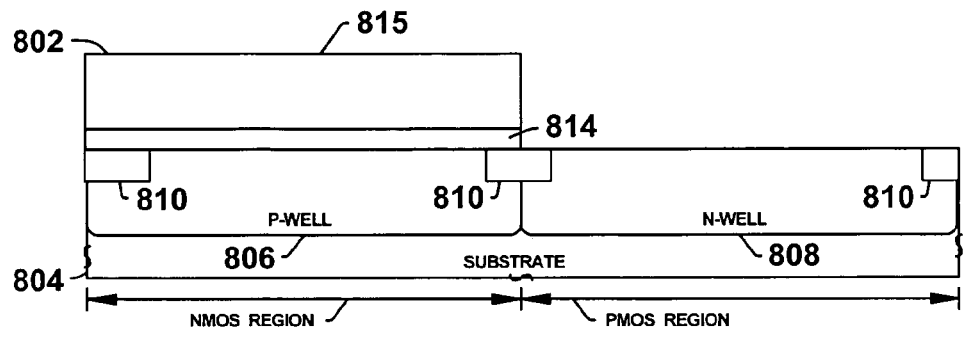
Figure 8D:
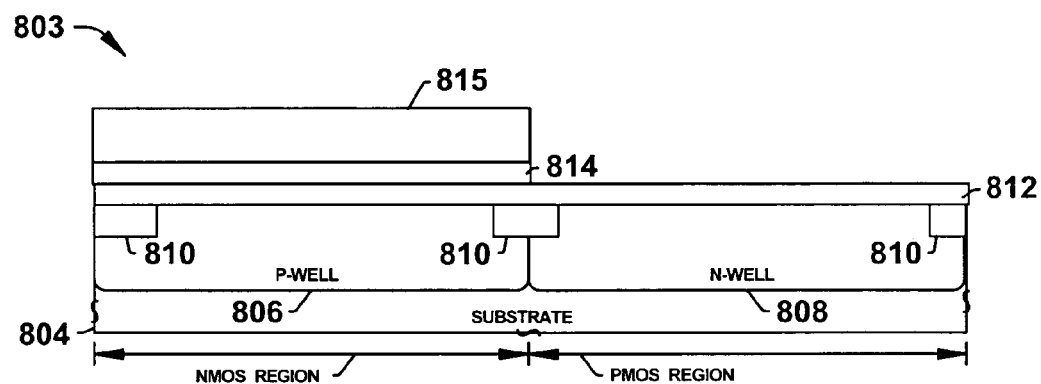

Subsequently, a resist mask (not shown) is employed to remove the cap layer 815 from the NMOS regions. The remaining cap layer 815 is employed as a mask to selectively remove the high-k dielectric layer 814 from the PMOS regions. FIGS. 8C and 8D depict the device at this stage of fabrication wherein the cap layer is removed from the PMOS region in both the core 802 and I/O 803 regions.

Further fabrication of the device continues according to the method 700 of FIG. 7. FIGS. 6A to 6R can be referenced for additional structural details which are omitted here.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device comprising:
    forming well regions and isolation regions within a semiconductor body defining PMOS and NMOS regions of first and second regions;
    forming an oxide layer on the semiconductor body within the first region and the second region;
    removing the oxide layer from the first region;
    forming a high-k dielectric layer over the first and second regions;
    selectively removing the high-k dielectric layer from the PMOS regions of the first and second regions;
    growing a silicon nitride layer within the PMOS regions of the first and second regions via a growth process;
    oxidizing the silicon nitride layer to form a silicon oxynitride layer; and
    forming a gate electrode layer over the device.

2. The method of claim 1, wherein the second region is designated for higher voltage operation than the first region.

3. The method of claim 1, wherein the first region is a core region and the second region is an I/O region.

4. The method of claim 1, wherein growing the silicon nitride layer comprises performing a nitridation process at a low temperature within the range of about 700 to 800 degrees Celsius.

5. The method of claim 1, wherein growing the silicon nitride layer includes nitriding the high-k dielectric layer.

6. The method of claim 1, wherein oxidizing the silicon nitride layer comprises performing a thermal oxidation process with nitrous oxide.

7. The method of claim 1, further comprising re-nitriding the silicon oxynitride layer and the high-k dielectric layer to a selected nitrogen concentration after oxidizing the silicon nitride layer.

8. The method of claim 1, further comprising forming a resist mask that exposes the PMOS regions of the first and second regions prior to removing the high-k layer from the PMOS regions.

9. The method of claim 1, further comprising forming a resist mask that exposes the PMOS regions of the first and second regions and the NMOS region of the second region prior to removing the high-k dielectric layer from the PMOS regions and removing the high-k dielectric layer from then NMOS region of the second region.

10. The method of claim 1, wherein forming the high-k dielectric layer comprises depositing hafnium silicate (HfSiO).

11. The method of claim 1, wherein forming the gate layer comprises depositing polysilicon over the device.

12. The method of claim 1, further comprising forming n-type source/drain regions within the NMOS regions of the first and second regions and p-type source/drain regions within the PMOS regions of the first and second regions.

13. A method of fabricating a semiconductor device comprising:
    forming well regions and isolation regions within a semiconductor body defining PMOS and NMOS regions of first and second regions;
    forming an oxide layer on the semiconductor body within the first region and the second region;
    removing the oxide layer from the first region;
    forming a high-k dielectric layer over the first and second regions;
    forming a cap layer over the first and second regions;
    forming a photoresist mask that exposes the cap layer within the PMOS regions of the first and second regions;
    removing the cap layer from the PMOS regions of the first and second regions;
    selectively removing the high-k dielectric layer from the PMOS regions of the first and second regions using the cap layer as a mask;
    removing the photoresist mask;
    removing the cap layer;
    growing a silicon nitride layer on the oxide layer within the PMOS region of the second region and on the semiconductor body within the PMOS region of the first region; and
    oxidizing the silicon nitride layer forming a silicon oxynitride layer.

14. The method of claim 13, wherein the first region is a core region and the second region is an I/O region.

15. The method of claim 13, further comprising forming a gate layer over the device, patterning the gate layer, the silicon oxynitride layer, the oxide layer, and the high-k dielectric layer to form gate electrodes.

16. The method of claim 13, wherein forming the cap layer comprises depositing polysilicon, SiGe, Ge, silicon nitride ($Si_3N_4$), silicon carbide (SiC) or carbon-doped $SiO_2$ (SiOC).

17. The method of claim 13, further comprising re-nitriding the silicon oxynitride layer to increase nitrogen concentration to a selected amount.

18. The method of claim 17, wherein removing the cap layer is performed after re-nitriding the silicon oxynitride.

19. A method of fabricating a semiconductor device comprising:

selecting first type dielectric characteristics for first type devices within a first region;

selecting second type dielectric characteristics for second type devices within the first region;

selecting first type dielectric characteristics for first type devices within a second region;

selecting second type dielectric characteristics for second type devices within the second region;

forming a dielectric layer over the device within the first region and the second region with a thickness at least partially selected according to the first type dielectric characteristics within second region;

removing the dielectric layer from the first region;

forming a high-k dielectric layer over the first and second regions having a thickness selected according to the selected second type dielectric characteristics within the first region;

selectively removing the high-k dielectric layer from the first type devices of the first and second regions;

growing a silicon nitride layer on the first type devices of the first and second regions having a thickness selected according to the first type dielectric characteristics within the first region; and oxidizing the silicon nitride layer into a silicon oxynitride layer.

20. The method of claim 19, further comprising performing a nitridation process after the oxidation of the silicon nitride layer.

21. The method of claim 19, wherein forming the high-k dielectric comprises forming HfSiON.

22. The method of claim 19, wherein selecting the first type dielectric characteristics within the first region comprises selecting a desired threshold voltage.

23. The method of claim 19, wherein the dielectric layer is oxynitride.

24. The method of claim 19, wherein the dielectric layer is oxide.

* * * * *